United States Patent
Zhu et al.

(10) Patent No.: US 8,797,202 B2
(45) Date of Patent: Aug. 5, 2014

(54) INTELLIGENT ELECTRONIC DEVICE HAVING CIRCUITRY FOR HIGHLY ACCURATE VOLTAGE SENSING

(75) Inventors: Hai Zhu, Westbury, NY (US); Tibor Banhegyesi, Baldwin, NY (US)

(73) Assignee: Electro Industries/Gauge Tech, Westbury, NY (US)

(*) Notice: Subject to any disclaimer, the term of this patent is extended or adjusted under 35 U.S.C. 154(b) by 0 days.

(21) Appl. No.: 13/074,560

(22) Filed: Mar. 29, 2011

(65) Prior Publication Data

US 2011/0260710 A1    Oct. 27, 2011

Related U.S. Application Data

(63) Continuation-in-part of application No. 12/339,825, filed on Dec. 19, 2008, now Pat. No. 7,916,060, which is a continuation-in-part of application No. 12/075,690, filed on Mar. 13, 2008, now Pat. No. 8,190,381.

(51) Int. Cl.
  *H03M 1/12*    (2006.01)

(52) U.S. Cl.
  USPC .......................................... 341/155; 330/252

(58) Field of Classification Search
  USPC .................. 341/155, 118, 120; 330/279, 252; 327/103; 702/60, 62
  See application file for complete search history.

(56) References Cited

U.S. PATENT DOCUMENTS

| | | |
|---|---|---|
| 2,883,255 A | 4/1959 | Anderson |
| 2,987,704 A | 6/1961 | Gimpel et al. |
| 3,142,820 A | 7/1964 | Daniels |
| 3,453,540 A | 7/1969 | Dusheck |
| 3,534,247 A | 10/1970 | Miljanic |
| 3,815,013 A | 6/1974 | Milkovic |
| 3,824,441 A | 7/1974 | Heyman et al. |
| 3,995,210 A | 11/1976 | Milkovic |
| 4,140,952 A | 2/1979 | Miller |
| 4,246,623 A | 1/1981 | Sun |
| 4,466,071 A | 8/1984 | Russell, Jr. |
| 4,495,463 A | 1/1985 | Milkovic |
| 4,841,236 A | 6/1989 | Miljanic et al. |
| 4,884,021 A | 11/1989 | Hammond et al. |
| 4,996,646 A | 2/1991 | Farrington |
| 5,006,846 A | 4/1991 | Granville et al. |
| 5,014,229 A | 5/1991 | Mofachern |

(Continued)

OTHER PUBLICATIONS

7700 Ion 3-Phase Power Meter, Analyzer and Controller, pp. 1-8, Nov. 30, 2000.
ION Technology, 7500 ION High Visibility 3-Phase Energy & Power Quality Meter, Power Measurement, specification, pp. 1-8, revision date Mar. 21, 2000.

(Continued)

*Primary Examiner* — Peguy Jean Pierre
(74) *Attorney, Agent, or Firm* — Gerald E. Hespos; Michael J. Porco; Matthew T. Hespos

(57) ABSTRACT

An intelligent electronic device (IED), e.g., an electrical power meter having circuitry for an input voltage structure with an adjusting voltage divider, resulting in a highly accurate power measurement, is provided. The IED includes a first voltage input for receiving a sensed voltage from a first phase of an electrical distribution system, the first voltage input being coupled to a first voltage divider; a second voltage input for receiving a sensed voltage from a neutral phase of the electrical distribution system, the second voltage input being coupled to a second voltage divider; and an inverting operational amplifier (op amp) coupled to the first and second voltage inputs for providing an output proportional to the voltage of the first phase referenced to the neutral phase, wherein the first voltage divider is adjustable to match a ratio of the first voltage divider to a ratio of the second voltage divider.

54 Claims, 11 Drawing Sheets

(56) References Cited

U.S. PATENT DOCUMENTS

| | | | |
|---|---|---|---|
| 5,166,887 A | 11/1992 | Farrington et al. | |
| 5,170,360 A | 12/1992 | Porter et al. | |
| 5,185,705 A | 2/1993 | Farrington | |
| 5,212,441 A | 5/1993 | McEachern et al. | |
| 5,220,495 A | 6/1993 | Zulaski | |
| 5,224,054 A | 6/1993 | Wallis | |
| 5,233,538 A | 8/1993 | Wallis | |
| 5,237,511 A | 8/1993 | Caird et al. | |
| 5,298,854 A | 3/1994 | McEachern et al. | |
| 5,298,855 A | 3/1994 | McEachern et al. | |
| 5,298,856 A | 3/1994 | McEachern et al. | |
| 5,298,859 A | 3/1994 | McEachern et al. | |
| 5,298,885 A | 3/1994 | McEachern et al. | |
| 5,298,888 A | 3/1994 | McEachern et al. | |
| 5,300,924 A | 4/1994 | McEachern et al. | |
| 5,302,890 A | 4/1994 | McEachern et al. | |
| 5,307,009 A | 4/1994 | McEachern et al. | |
| 5,315,527 A | 5/1994 | Beckwith | |
| 5,347,464 A | 9/1994 | McEachern et al. | |
| 5,438,257 A | 8/1995 | Berkcan | |
| 5,459,395 A | 10/1995 | Berkcan | |
| 5,544,064 A | 8/1996 | Beckwith | |
| 5,559,719 A | 9/1996 | Johnson et al. | |
| 5,568,047 A | 10/1996 | Staver et al. | |
| 5,574,654 A | 11/1996 | Bingham et al. | |
| 5,581,173 A | 12/1996 | Yalla et al. | |
| 5,706,204 A | 1/1998 | Cox et al. | |
| 5,764,523 A | 6/1998 | Yoshinaga et al. | |
| 5,774,366 A | 6/1998 | Beckwith | |
| 5,819,203 A | 10/1998 | Moore et al. | |
| 5,822,165 A | 10/1998 | Moran | |
| 5,832,210 A | 11/1998 | Akiyama et al. | |
| 5,899,960 A | 5/1999 | Moore et al. | |
| 5,952,819 A | 9/1999 | Berkcan et al. | |
| 6,018,690 A | 1/2000 | Saito et al. | |
| 6,018,700 A | 1/2000 | Edel | |
| 6,023,160 A | 2/2000 | Coburn | |
| 6,038,516 A | 3/2000 | Alexander et al. | |
| 6,098,175 A | 8/2000 | Lee | |
| 6,157,329 A | 12/2000 | Lee et al. | |
| 6,167,329 A | 12/2000 | Engel et al. | |
| 6,195,614 B1 | 2/2001 | Kochan | |
| 6,289,267 B1 | 9/2001 | Alexander et al. | |
| 6,417,661 B1 | 7/2002 | Berkcan et al. | |
| 6,423,960 B1 | 7/2002 | Engelhardt et al. | |
| 6,433,981 B1 | 8/2002 | Fletcher et al. | |
| 6,444,971 B1 | 9/2002 | Engelhardt et al. | |
| 6,479,976 B1 | 11/2002 | Edel | |
| 6,493,644 B1 | 12/2002 | Jonker et al. | |
| 6,519,537 B1 | 2/2003 | Yang | |
| 6,522,517 B1 | 2/2003 | Edel | |
| 6,528,957 B1 | 3/2003 | Luchaco | |
| 6,590,380 B2 | 7/2003 | Edel | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,674,379 B1 | 1/2004 | Li et al. | |
| 6,717,394 B2 | 4/2004 | Elms | |
| 6,735,535 B1 | 5/2004 | Kagan et al. | |
| 6,751,563 B2 | 6/2004 | Spanier et al. | |
| 6,792,364 B2 | 9/2004 | Jonker et al. | |
| 6,842,707 B2 | 1/2005 | Raichle et al. | |
| 6,957,158 B1 | 10/2005 | Hancock et al. | |
| 6,963,195 B1 | 11/2005 | Berkcan | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| 7,126,493 B2 | 10/2006 | Junker et al. | |
| 7,174,261 B2 | 2/2007 | Gunn et al. | |
| 7,239,184 B2 * | 7/2007 | Cetrulo et al. | 327/103 |
| 7,304,829 B2 | 12/2007 | Nadipuram et al. | |
| 7,313,176 B1 * | 12/2007 | Groen | 375/219 |
| 7,337,081 B1 | 2/2008 | Kagan | |
| 7,342,507 B2 | 3/2008 | Jonker et al. | |
| 7,372,574 B2 | 5/2008 | Sanders et al. | |
| 7,436,687 B2 | 10/2008 | Patel | |
| 7,444,454 B2 | 10/2008 | Yancey et al. | |
| 7,511,468 B2 | 3/2009 | McEachern et al. | |
| 7,514,907 B2 | 4/2009 | Rajda et al. | |
| 7,616,656 B2 | 11/2009 | Wang et al. | |
| 7,899,630 B2 | 3/2011 | Kagan | |
| 7,916,060 B2 | 3/2011 | Zhu et al. | |
| 7,962,298 B2 | 6/2011 | Przydatek et al. | |
| 8,063,704 B2 * | 11/2011 | Wu et al. | 330/279 |
| 8,190,381 B2 | 5/2012 | Spanier et al. | |
| 8,269,482 B2 | 9/2012 | Banhegyesi | |
| 2002/0032535 A1 | 3/2002 | Alexander et al. | |
| 2002/0169570 A1 | 11/2002 | Spanier et al. | |
| 2003/0014200 A1 | 1/2003 | Jonker et al. | |
| 2003/0178982 A1 | 9/2003 | Elms | |
| 2003/0187550 A1 | 10/2003 | Wilson et al. | |
| 2004/0172207 A1 | 9/2004 | Hancock et al. | |
| 2004/0193329 A1 | 9/2004 | Ransom et al. | |
| 2005/0027464 A1 | 2/2005 | Jonker et al. | |
| 2005/0060110 A1 | 3/2005 | Jones et al. | |
| 2005/0093571 A1 | 5/2005 | Suaris et al. | |
| 2005/0187725 A1 | 8/2005 | Cox | |
| 2005/0273280 A1 | 12/2005 | Cox | |
| 2006/0052958 A1 | 3/2006 | Hancock et al. | |
| 2006/0066456 A1 | 3/2006 | Jonker et al. | |
| 2006/0083260 A1 | 4/2006 | Wang et al. | |
| 2006/0145890 A1 | 7/2006 | Junket et al. | |
| 2006/0161360 A1 | 7/2006 | Yao et al. | |
| 2006/0267560 A1 | 11/2006 | Rajda et al. | |
| 2007/0067119 A1 | 3/2007 | Loewen et al. | |
| 2007/0067121 A1 | 3/2007 | Przydatek et al. | |
| 2007/0096765 A1 | 5/2007 | Kagan | |
| 2007/0096942 A1 | 5/2007 | Kagan et al. | |
| 2008/0086222 A1 | 4/2008 | Kagan | |
| 2008/0147334 A1 | 6/2008 | Kagan | |
| 2008/0172192 A1 | 7/2008 | Banhegyesi | |
| 2008/0215264 A1 | 9/2008 | Spanier et al. | |
| 2008/0234957 A1 | 9/2008 | Banhegyesi et al. | |
| 2008/0235355 A1 | 9/2008 | Spanier et al. | |
| 2008/0238406 A1 | 10/2008 | Banhegyesi | |
| 2008/0238713 A1 | 10/2008 | Banhegyesi et al. | |
| 2009/0012728 A1 | 1/2009 | Spanier et al. | |
| 2009/0096654 A1 | 4/2009 | Zhu et al. | |
| 2009/0228224 A1 | 9/2009 | Spanier et al. | |
| 2010/0054276 A1 | 3/2010 | Wang et al. | |
| 2010/0324845 A1 | 12/2010 | Spanier et al. | |
| 2011/0040809 A1 | 2/2011 | Spanier et al. | |
| 2011/0270551 A1 | 11/2011 | Kagan et al. | |

OTHER PUBLICATIONS

ION Technology, 7500 ION 7600 ION High Visibility Energy & Power Quality Compliance Meters, Power Measurement, specification, pp. 1-8, revision date Nov. 30, 2000.

User's Installation & Operation and User's Programming Manual. The Futura Series, Electro Industries, pp. 1-64, Copyright 1995.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure Technology, Electro IndustrieslGauge Tech, specification, 16 pages, Nov. 1999.

Performance Power Meter & Data Acquisition Node, Electro Industries/Gauge Tech., Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

PowerLogic Series 4000 Circuit Monitors, pp. 1-4; Document #3020HO0601; Jan. 2006.

ION7550/ion7650 PowerLogic power-monitoring units, Technical data sheets, Copyright 2006 Schneider Electric.

IEC 61000-4-15: Electromagnetic compatibility (EMC) Part 4: Testing and measuring techniques, Section 15: Flickermeter—Functional and design specifications; CENELEC—European Committee for Electrotechnical Standardization; Apr. 1998.

* cited by examiner

INTELLIGENT ELECTRONIC DEVICE HAVING CIRCUITRY FOR HIGHLY ACCURATE VOLTAGE SENSING

PRIORITY

This application is a continuation-in-part application of U.S. patent application Ser. No. 12/339,825, filed on Dec. 19, 2008, which is a continuation-in-part application of U.S. patent application Ser. No. 12/075,690 filed on Mar. 13, 2008, the contents of all of which are hereby incorporated by reference in their entireties.

BACKGROUND

1. Field

The present disclosure relates generally to intelligent electronic devices (IEDs) for electrical power systems, and more particularly, to an intelligent electronic device having circuitry for an input voltage structure with an adjusting voltage divider, resulting in a highly accurate power measurement.

2. Description of the Related Art

Electric utility companies ("utilities") track electric usage by customers by using power meters, also known as intelligent electronic device (IEDs). These meters track the amount of power consumed at a particular location. These locations range from power substations, to commercial businesses, to residential homes. The electric utility companies use information obtained from the power meter to charge its customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., a substation. These power and energy meters are installed in substations to provide a visual display of real-time data and to alarm when problems occur. These problems include limit alarms, breaker control, outages and many other types of events. Conventionally, the visual display includes numerical information and/or an alarm indication, e.g., a LED, on the face of the meter.

To determine power consumed in a system, a power meter measures or senses current and voltage of at least one phase of the power distribution system. Voltage transformers, or potential transformers, in the power meter are used to sense or measure the voltage. The sensed voltage signal is transmitted to an analog-to-digital converter (ADC) in the power meter for conversion from analog to digital data, which is stored or processed by the power meter.

Common-mode noise, which can be caused by noise from power lines, power supply ripple, electromagnetic fields, radio frequencies, or high-frequency switching noise, for example, may be present in the voltage transmitted to the voltage input ADC. This noise causes loss of accuracy in meter readings, which can negatively impact the meter's ability to be used for revenue and billing purposes. Various ways of reducing this noise, thereby improving meter accuracy, have been implemented in the art. These solutions have involved changes to the voltage input ADC in the attempt to improve accuracy by reducing common-mode noise.

The structure of the voltage input ADC can be one of three types: single-ended, pseudo-differential, and fully-differential. Additionally, some ADCs known in the art can be configured as either single-ended or pseudo-differential voltage inputs (such as model MAX186 and MAX147 from Maxim Integrated Products, Inc. of Sunnyvale, Calif.); or single-ended or fully-differential voltage inputs (such as model MAX1298 and MAX1286 from Maxim Integrated Products, Inc. of Sunnyvale, Calif.).

Each of these types of voltage input ADCs has benefits as well as drawbacks. With the single-ended voltage input ADC, all voltage signals are referenced to a common ground at the ADC, with each voltage channel using a single input pin. An example of a single-ended voltage input ADC is depicted in FIG. 1A. If the signal source and the ADC are in close proximity, this structure works well. However, DC offset and noise in the signal path decrease the dynamic range of the voltage input signal. The single-ended voltage input ADC has the advantage of being the most inexpensive of the ADC types, but it may not yield accurate enough results for the billing or revenue functions of a power meter.

The pseudo-differential voltage input ADC separates signal ground from the ADC ground, allowing DC common-mode voltages to be cancelled, but this structure does not compensate for AC dynamic common-mode noise. An example of a pseudo-differential voltage input ADC is depicted in FIG. 1B. Even though the pseudo-differential voltage input ADC produces data with greater accuracy than the single-ended structure, it does not filter out all common-mode noise.

The fully-differential voltage input ADC offers maximum noise rejection of the three ADC structures mentioned. An example of a fully-differential voltage input ADC is depicted in FIG. 1C. Like the pseudo-differential ADC, the fully-differential ADC separates signal ground from the ADC ground, rejecting DC common-mode voltages. This structure ADC also offers dynamic common-mode noise rejection, by measuring the difference in voltage between the positive and negative terminals of the voltage sensor. However, the fully-differential input voltage ADC is both more complex and more expensive than the other two structures.

Therefore, there is an increasing demand in the electrical metering industry for devices, such as electrical power meters, analyzers, etc., to be able to accurately measure AC current and its related parameters, e.g., power, energy, power factor, etc., with higher dynamic range and higher precision without incurring significant additional complexity and cost of a implementing fully differential input voltage paths to the ADC.

SUMMARY

An intelligent electronic device (IED), e.g., an electrical power meter having circuitry for an input voltage structure with an adjusting voltage divider, resulting in a highly accurate power measurement, is provided. The IED includes a first voltage input for receiving a sensed voltage from a first phase of an electrical distribution system, the first voltage input being coupled to a first voltage divider; a second voltage input for receiving a sensed voltage from a neutral phase of the electrical distribution system, the second voltage input being coupled to a second voltage divider; and an inverting operational amplifier (op amp) coupled to the first and second voltage inputs for providing an output proportional to the voltage of the first phase referenced to the neutral phase, wherein the first voltage divider is adjustable to match a ratio of the first voltage divider to a ratio of the second voltage divider.

The above and other aspects, features, and advantages of the present disclosure will become more apparent in light of the following detailed description when taken in conjunction with the accompanying drawings.

Figure 1A:
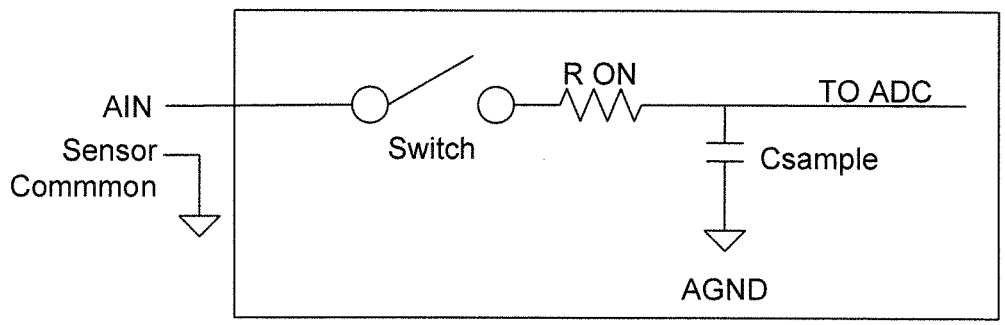
FIG. 1A is a diagram of a prior art single-ended voltage input for an analog-to-digital converter.
Figure 1B:
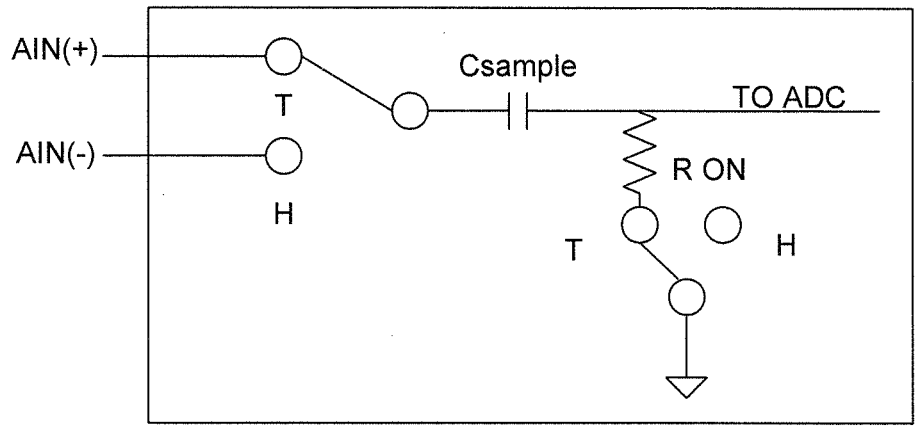
FIG. 1B is a diagram of a prior art pseudo-differential voltage input for an analog-to-digital converter.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces, programmable logic or other device or devices.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage, programmable logic or other device or devices.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as electric power meters and power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances.

It will be appreciated by those skilled in the art that the disclosure may also be utilized within the context of other IEDs, including Programmable Logic Controllers (PLC's), Remote Terminal Units (RTUs), protective relays, fault recorders, and meters, among other devices or systems used to manage and control quality, distribution, and consumption of electrical power.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

Figure 2:
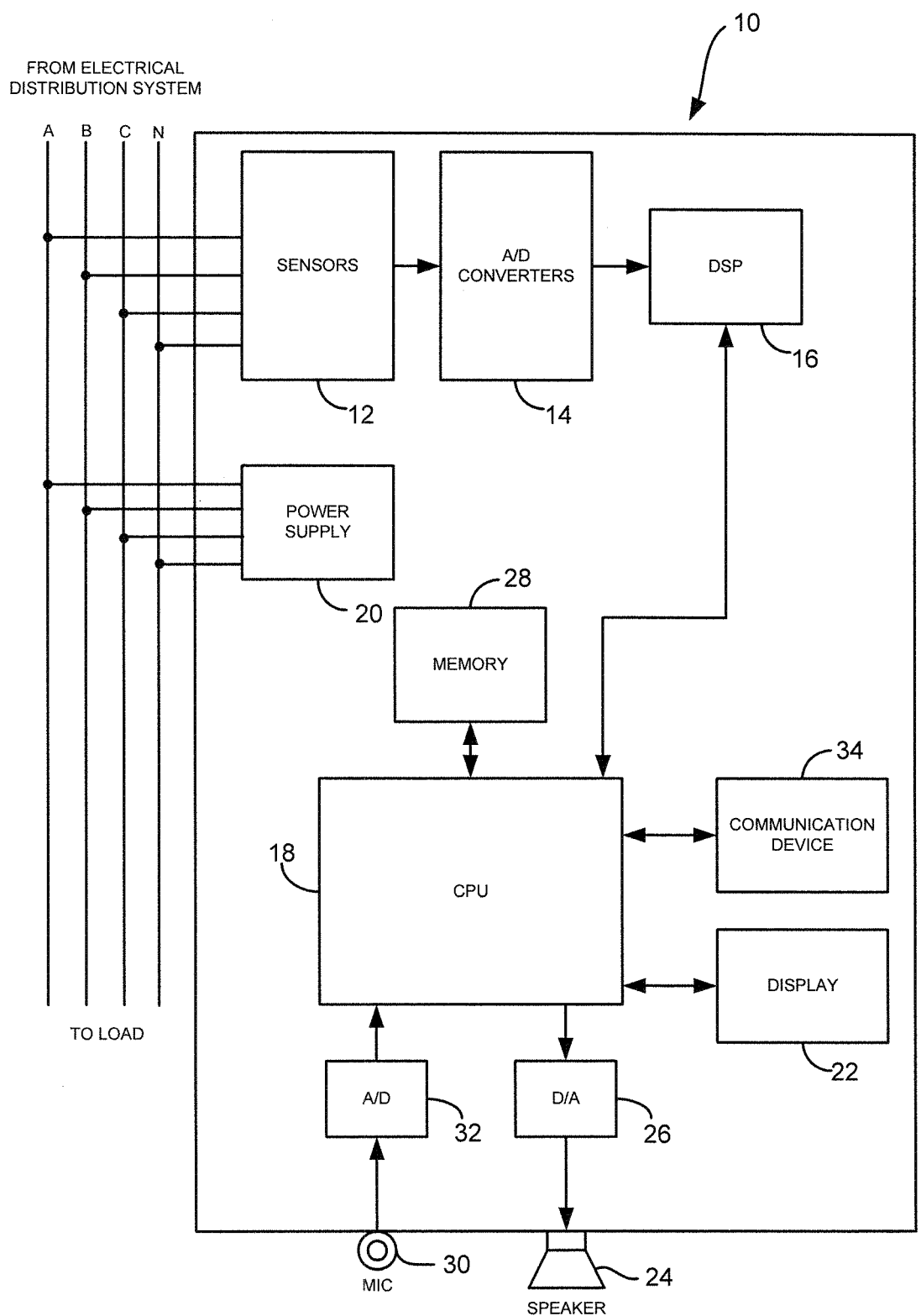
FIG. 2 is a diagram of an intelligent electronic device in accordance with one embodiment of the present disclosure.

An intelligent electronic device (IED) 10 for monitoring and determining an amount of electrical power usage by a consumer and for providing audible and visual indications to a user is illustrated in FIG. 2. Generally, the IED 10 includes sensors 12, a plurality of analog-to-digital converters (ADCs) 14 and a processing system including a central processing unit (CPU) 18 and/or a digital signal processor (DSP) 16. The sensors 12 will sense electrical parameters, e.g., voltage and current, of the incoming lines from an electrical power distribution system, e.g., an electrical circuit. Preferably, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current.

Figure 1C:
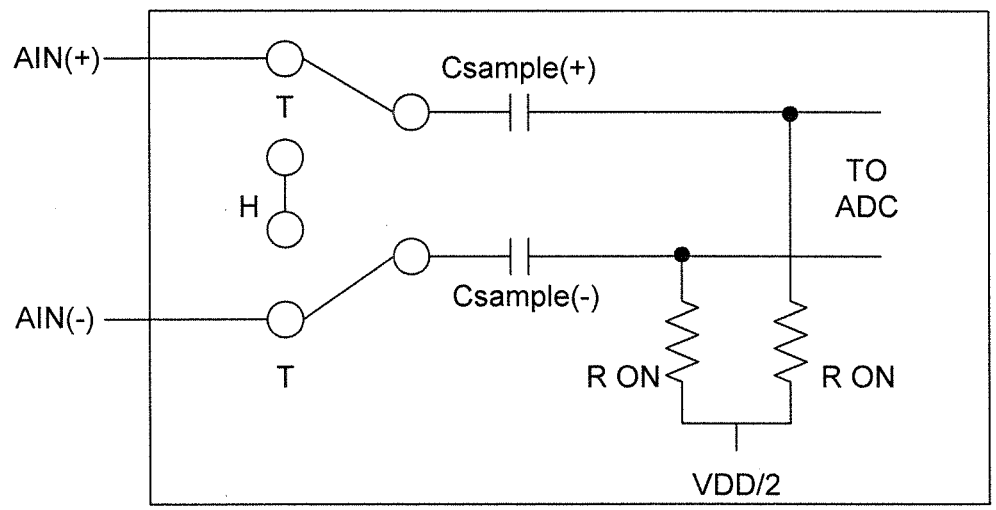
FIG. 1C is a diagram of a prior art fully-differential voltage input for an analog-to-digital converter.
Figure 3A:
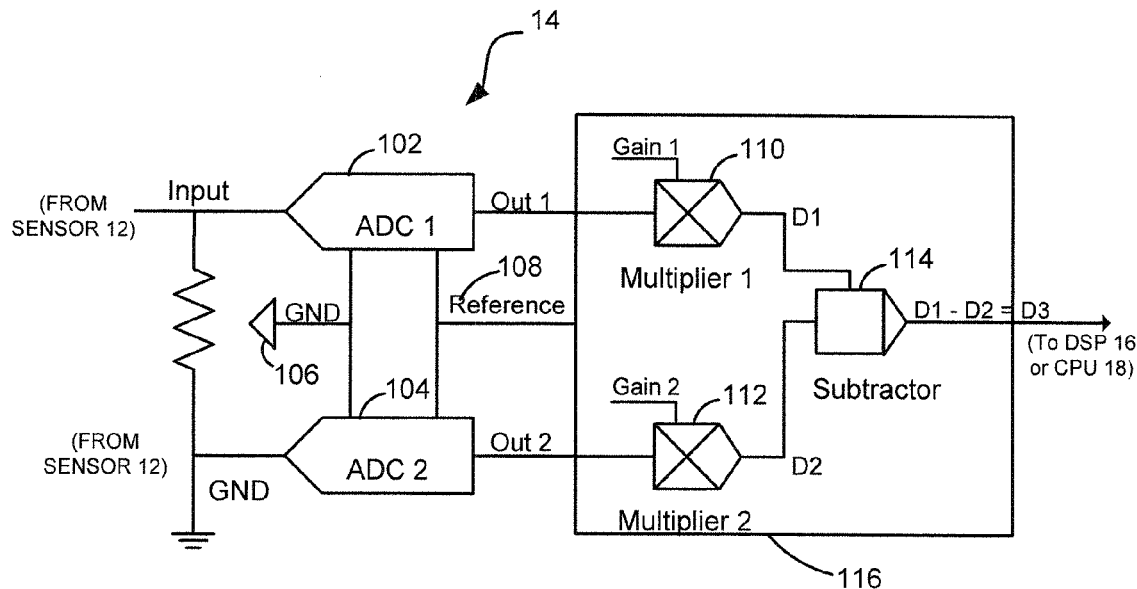
FIG. 3A is a diagram of one embodiment of a hybrid-differential structure for a voltage input analog-to-digital converter in accordance with the present disclosure.

The voltage output of the sensors 12 will be converted to a digital signal by the ADCs 14. FIG. 3A depicts one example of an embodiment of a hybrid-differential voltage input ADC that can be used as one of the ADCs 14 depicted in FIG. 2. This structure allows for double sampling, as with the fully-differential voltage input ADC depicted in FIG. 1C, but instead the subtraction is performed under the control of software or a programmable device 116, such as a Field Programmable Gate Array (FPGA), a Complex Programmable Logic Device (CPLD), or a microcontroller, for example, resulting in an output free of dynamic common-mode noise.

In FIG. 3A, ADC 1 102 and ADC 2 104 are each single-ended voltage input ADCs. The single-ended voltage input ADC used for ADC 1 102 should have the same parameters, such as direct current (DC) and alternating current (AC) performance for example, as the single-ended voltage input ADC used for ADC 2 104. An example of a commercially available single-ended voltage input ADC that can be used for ADC 1 102 and ADC 2 104 is model AD7656 from Analog Devices, Inc. of Norwood, Mass. ADC 1 102 connects to the signal input, which, in the example depicted in FIG. 2, would be the voltage signal output from sensor 12. However, if the sensor 12 outputs a current signal, the output from the current sensor can be converted to a voltage before being inputted into ADC 1 102. ADC 2 104 connects to the ground which the signal is referenced to (i.e. the ground used for sensor 12). Additionally, ADC 1 102 and ADC 2 104 must each be connected to a common ground 106 and a common voltage reference 108. ADC 1 102 and ADC 2 104 must also perform simultaneous sampling of the signal input and the signal ground.

When ADC 1 102 and ADC 2 104 each sample the analog input signal, ADC 1 102 and ADC 2 104 each output a corresponding digital signal. The difference between the output from ADC 1 102 (i.e. Out 1) and the output from ADC 2 104 (i.e. Out 2) is the common-mode noise present at the output of sensor 12. Subtracting Out 2 from Out 1 subtracts out this noise, resulting in a digital signal of the sensor 12 reading without the common-mode noise. It should be noted that the effectiveness of this implementation is by using two channels within the same physical device which has multiple ADC's. This provides matched delays for the signal paths for both signals so that the subtraction is very accurate in time. This subtraction is performed by the programmable device 116 described above. The programmable device 116 can also multiply each of the outputs by a predetermined gain compensation to correct any discrepancies between ADC 1 102 and ADC 2 104. After the discrepancies are compensated for by adding gain, the programmable device 116 subtracts the two results from each other to obtain the digital signal free of noise. In FIG. 3A, Multiplier 1 110 multiplies Out 1 by Gain 1 to obtain the result D1. Multiplier 2 112 multiplies Out 2 by Gain 2 to obtain the result D2. Subtractor 114 subtracts D2 from D1 to obtain the noise-free digital signal D3. The output from the hybrid-differential voltage input ADC 14 is sent to either the DSP 16 or the CPU 18. Operating in the digital domain to make the corrections supports very accurate adjustment capability and repeatable results and with either no calibration of the circuitry or greatly simplified calibration procedures to make the correction.

It is to be appreciated that the functionality of programmable device 116 could be implemented in DSP 16 and/or CPU 18, where the programmable device 116 would not be a hardware component but a software component.

Figure 3B:
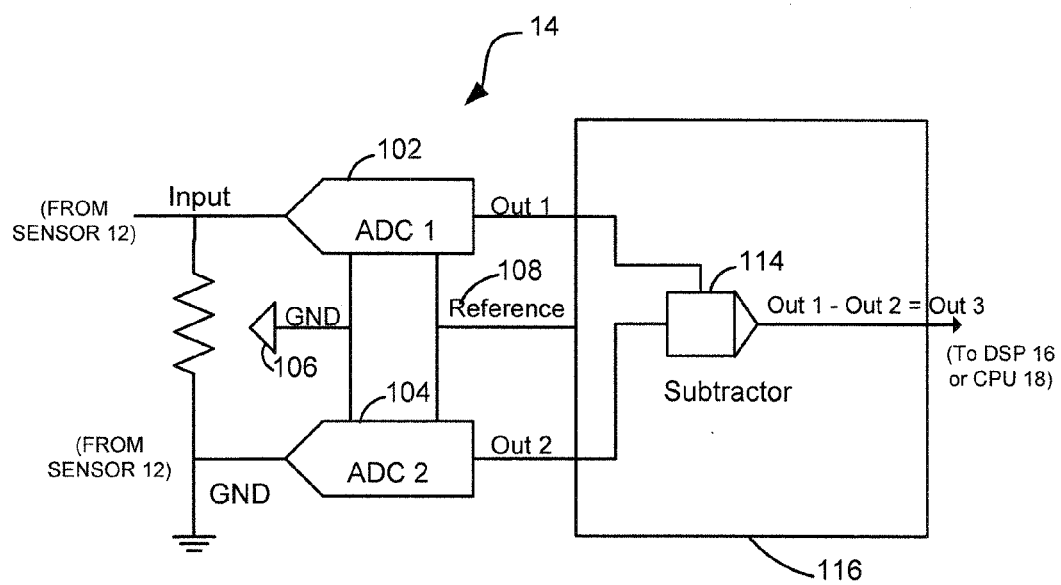
FIG. 3B is a diagram of one embodiment of a hybrid-differential structure for a voltage input analog-to-digital converter in accordance with the present disclosure.

FIG. 3B depicts an alternate embodiment for a hybrid-differential voltage input ADC 14. In FIG. 3B, there is no gain compensation required because ADC 1 102 and ADC 2 104 have no or minimal discrepancies. ADC 1 102 has an input that is the signal output from sensor 12. ADC 2 104 has an input that is the signal ground from sensor 12. ADC 1 102 and ADC 2 104 are connected to a common ground 106 and a common voltage reference 108. The output of ADC 1 102 is Out 1, which is a digital signal that was converted from the analog input signal from sensor 12. The output of ADC 2 104 is Out 2, which is the digital signal that was converted from the analog input ground signal from sensor 12. Subtractor 114 subtracts Out 2 from Out 1 to obtain a digital signal Out 3 corresponding to the sensor 12 analog output free from common-mode noise. Operating in the digital domain to make the corrections supports very accurate adjustment capability and repeatable results with either no calibration or greatly simplified calibration procedures to make the correction. The digital signal is sent to DSP 16 or CPU 18.

In one implementation of the present disclosure, two Analog Device AD7656 ADCs are used. Each AD7656 has 6 voltage input channels in 3 pairs. For this implementation, the voltage sampling signals are synchronized, and the on-chip reference source is utilized. There are 12 channel ADC available but only 8 signals need to be measured: Vae, Vbe, Vce, Vne, Via, Vib, Vic, and Vin; here, the current has been converted into voltage to measure. Vae, Vbe, Vce, and Vne are connected to one chip; Via, Vib, Vic, and Vin are connected to a second chip. The other four channels of the 12-channel ADC are connected to ground. The programmable device, e.g., FPGA, performs the subtraction on the signals, as seen in the following equations.

$$Vae - Vne = Van \quad (1)$$

$$Vbe - Vne = Vbn \quad (2)$$

$$Vce - Vne = Vcn. \quad (3)$$

After the subtraction, the resulting output is free of dynamic common-mode noise.

Figure 5:
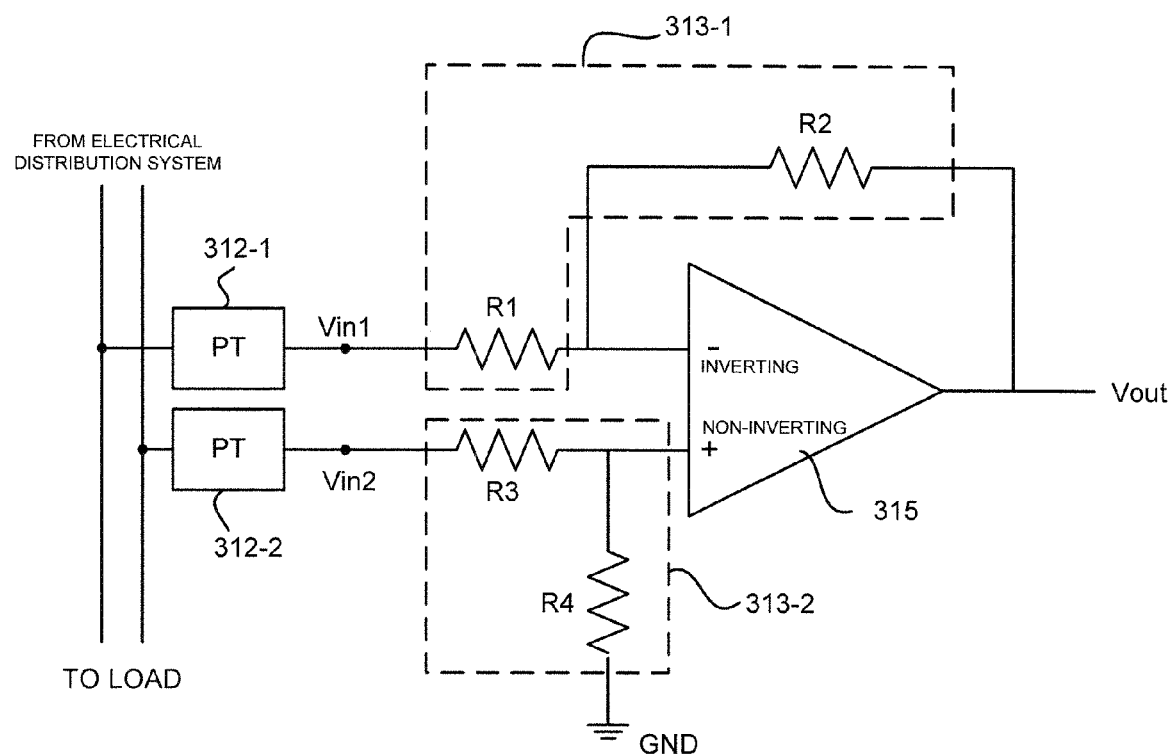
FIG. 5 is a diagram of a voltage sensing circuit in accordance with an embodiment of the present disclosure.

In another embodiment, a highly accurate voltage output can be achieved between any two phases of the electrical distribution system, e.g., Van, Vbn, Vcn, by employing an adjustable voltage divider at the front end of the meter. Referring to FIG. 5, a potential transformer 312-1 senses the voltage from one phase of the electrical distribution system and provides an output to the adjustable voltage divider 313-1. A second potential transformer 312-2 senses the voltage from another phase of the electrical distribution system and provides an output to a second adjustable voltage divider 313-2. An operational amplifier (op amp) 315 receives the outputs of the voltage dividers (i.e., the output of the first voltage divider 312-1 is coupled to an inverting input of the op amp 315 and the output of the second voltage divider 312-2 is coupled to a non-inverting input of the op amp 315) and performs a subtraction of the two phases, wherein the output Vout of the op amp 315 is subsequently provided to an A/D converter, e.g., A/D converter 14. The output of the op amp Vout is proportional to the sensed voltage of the first phase referenced to the sensed voltage of the second phase. The circuit shown in FIG. 5 follows:

$$Vout = gain(Vin2 - Vin1) \quad (4)$$

where gain=R2/R1=R4/R3.
By having the ratio of R2/R1 equal R4/R3, the output of the op amp 315 will be highly accurate.

It is to be appreciated that the circuit shown in FIG. 5 may be directly coupled to the electrical distribution system and in such an embodiment the sensors or potential transformers 312-1, 312-2 will not be required.

In another embodiment, the first voltage divider circuit 313-1 and op amp 315 may be part of the sensor, e.g., sensor 12 shown in FIG. 2, where Vout would be coupled to A/D converter 14. In this embodiment, the non-inverting input of the op amp is fed from the voltage divider of the reference phase.

Figure 6:
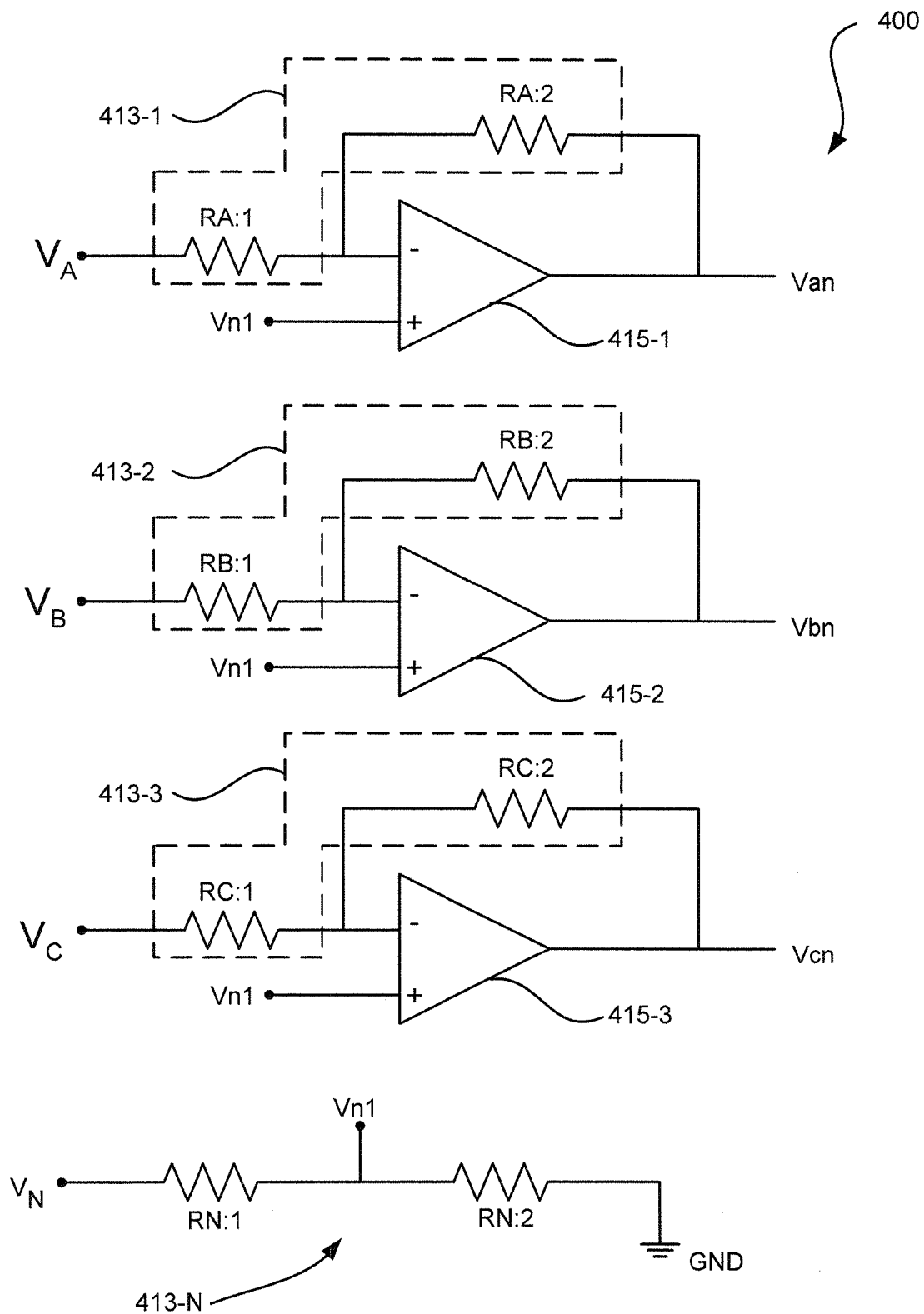
FIG. 6 is a diagram of a voltage sensing circuit for a three phase electrical distribution system in accordance with the present disclosure.

Referring to FIG. 6, a voltage input circuit 400 for a three phase electrical distribution system is provided. Here, a voltage divider 413-X and op amp 415-X is provided for each phase of the electrical distribution system, e.g., Phase A includes voltage divider 413-1 and op amp 415-1, Phase B includes voltage divider 413-2 and op amp 415-2, Phase C includes voltage divider 413-3 and op amp 415-3. A single voltage divider 413-N is provided for the neutral phase which is coupled to the op amp associated to each phase. By adjusting the voltage divider in each circuit to be equal, highly accurate outputs will result for Van, Vbn and Vcn. Therefore, the circuit shown in FIG. 6 must follow the following equation:

$$\frac{RA:1}{RA:2} = \frac{RB:1}{RB:2} = \frac{RC:1}{RC:2} = \frac{RN:1}{RN:2} \quad (5)$$

To satisfy equation 5, one of the voltage dividers is selected as the reference. In one embodiment, the voltage divider associated with the neutral phase is selected as the reference. Once the reference voltage divider is selected, the voltage divider associated with each phase is adjusted to equal the resistance ratios of the reference voltage divider while maintaining the gain. Due to variance of resistors, this can not be accomplished by simply selecting resistors of the same value.

Figure 7:
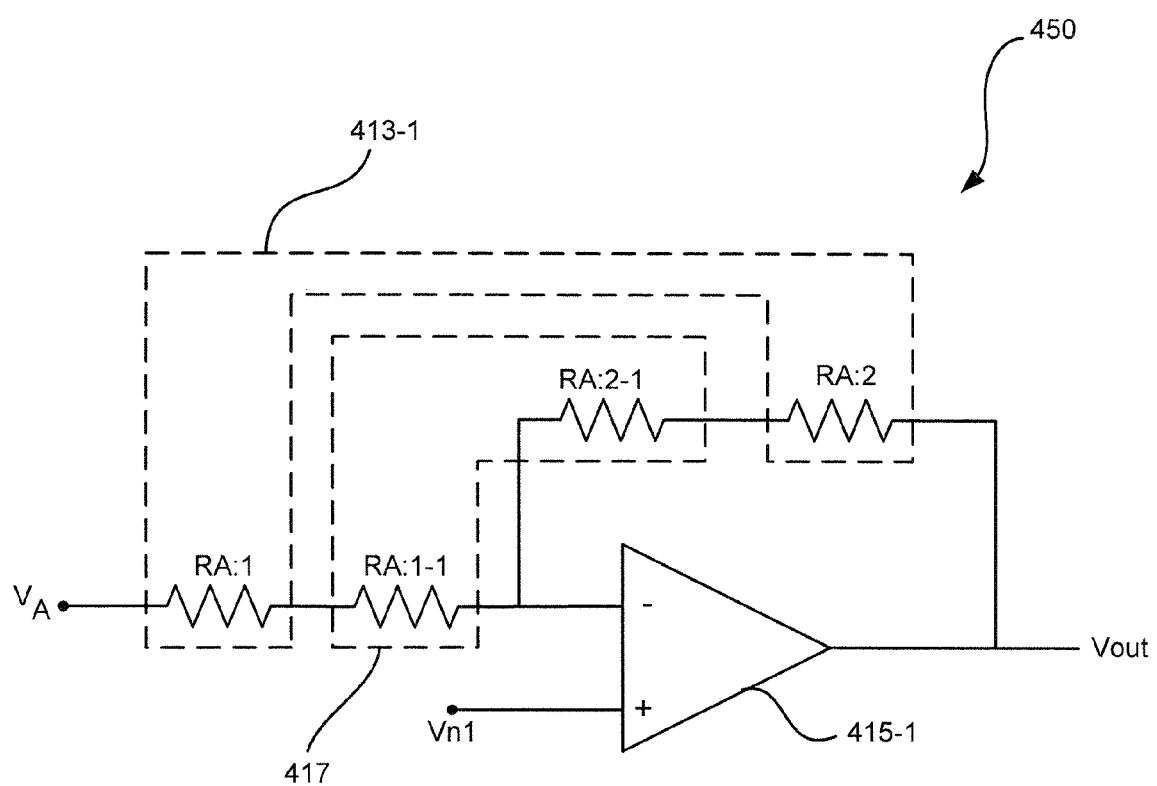
FIG. 7 is a diagram of a voltage sensing circuit having an adjustable voltage divider in accordance with an embodiment of the present disclosure.
Figure 8A:
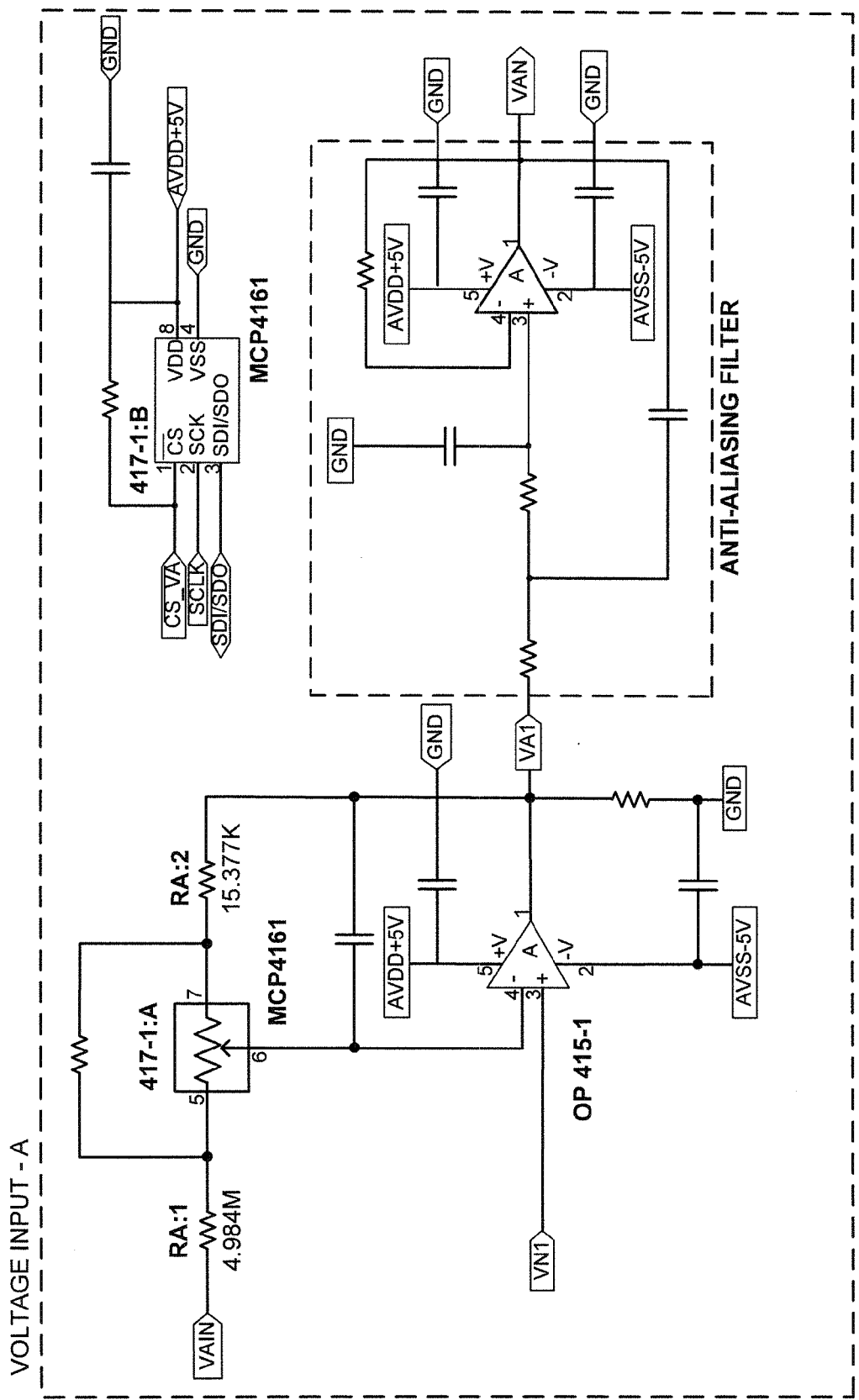
FIG. 8 is an exemplary circuit diagram of a voltage sensing system for sensing voltages of a three phase electrical distribution system in accordance with the present disclosure.
Figure 8B:
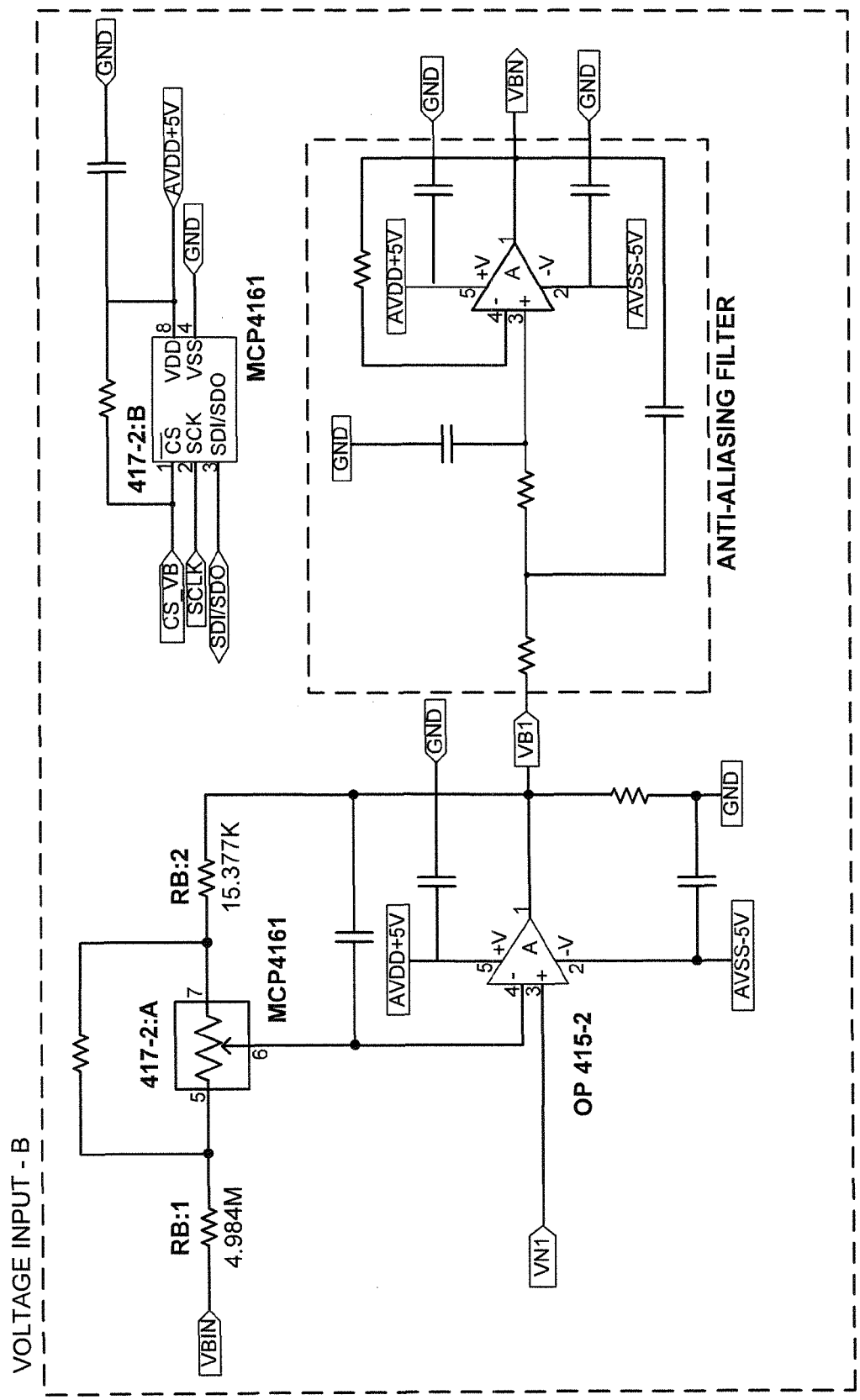
Figure 8C:
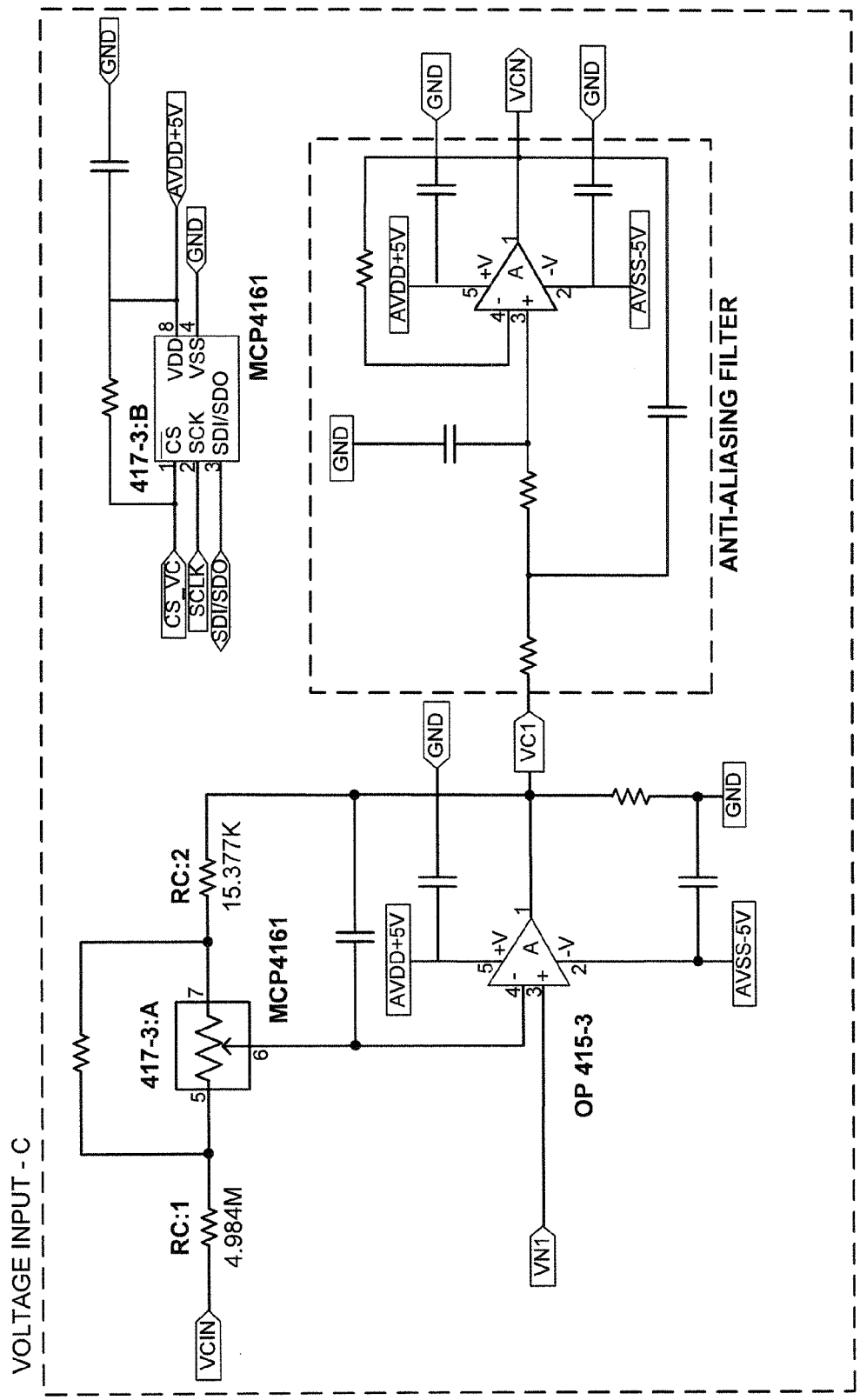
Figure 8D:
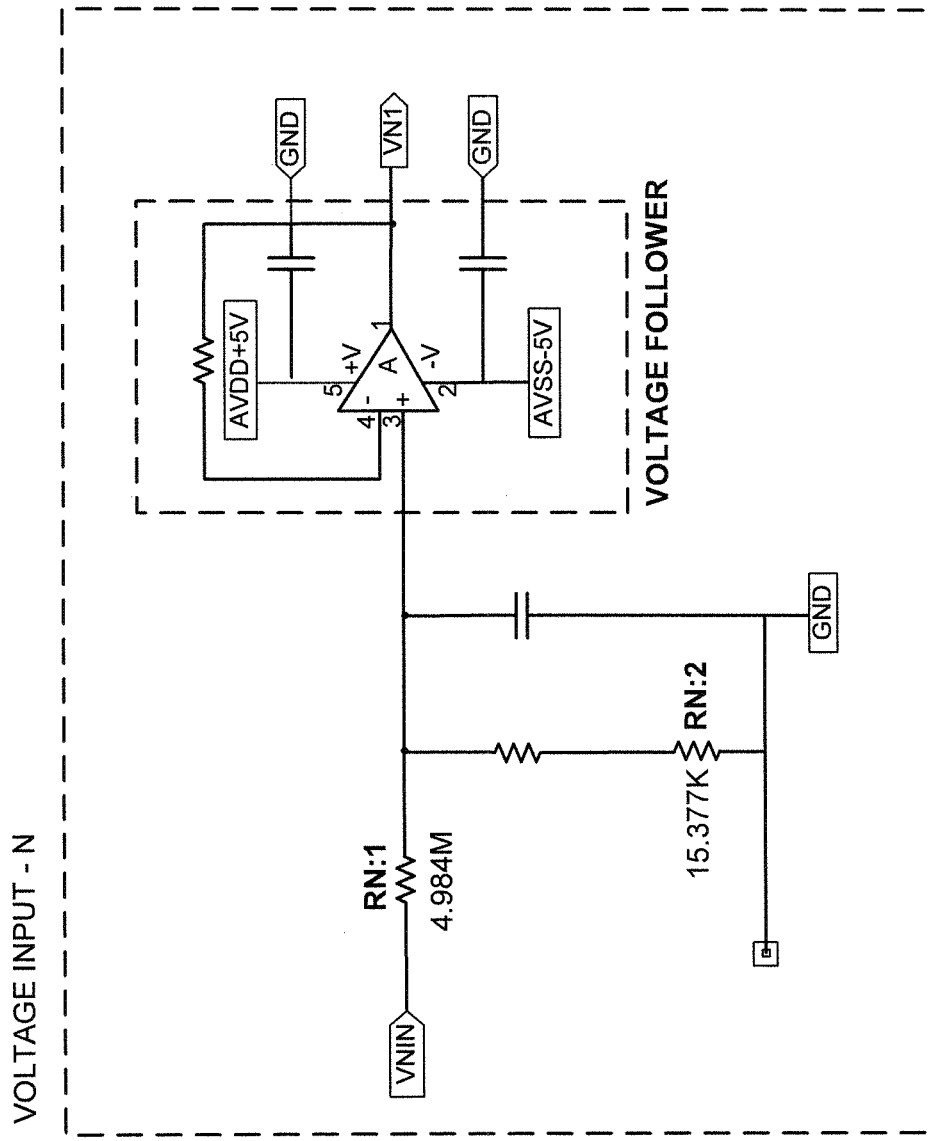

Referring to FIG. 7, a front end voltage sensing circuit 450 having a voltage divider capable of being precisely adjusted to a predetermined value is illustrated. In FIG. 7, only a circuit for one phase, i.e., Phase A of the electrical distribution system, is illustrated but it is to be appreciated that this configuration is to be provided for each phase after a reference circuit is determined. In voltage sensing circuit 450, an adjustable resistance component 417 is provided. In one embodiment, the adjustable resistance component 417 is a potential meter where the resistance values for resistor RA:1-1 and RA:2-1 are variable but the sum of the resistance is fixed. An exemplary potential meter is Model MCP4161 7/8-bit single/dual SPI digital POT with non-volatile memory commercially available from Microchip Technology, Inc. of Chandler, Ariz.

By providing the adjustable resistance component 417, the voltage sensing circuit 450 can be precisely tuned to the reference circuit. For example, in one embodiment, the circuit for sensing the neutral phase of the electrical distribution system is selected as the reference circuit. Here, the resistance values for resistors RN:1 and RN:2, as shown in FIG. 6, are fixed. Then, each voltage sensing circuit for each phase of the electrical distribution system is tuned to the reference circuit. The voltage sensing circuit 450 for Phase A of the electrical distribution system is then tuned to the reference circuit by adjusting the adjustable resistance component 417. It is to be appreciated that the resistors of the first voltage divider 413-1, i.e., resistor RA:1 and RA:2, are fixed. The voltage sensing circuits for Phase B and C will then be adjusted in a similar manner. In this manner equation 5 can be satisfied resulting in a highly accurate output for each sensed phase of the electrical distribution system, i.e., Van, Vbn, Vcn, throughout the entire sensed range of the potential transformer.

It should be noted that the tuning process can be conducted in either the analog or digital domains or a combination thereof. Moreover, the tuning can be done using a microprocessor, FPGA or other intelligent logic device. In one embodiment, a highly accurate multimeter such as but not limited to an Agilent 3458 Multimeter, commercially available from Agilent Technologies, Inc. of Santa Clara, Calif., can be used to measure the voltages to provide the tuning values.

In another embodiment, the voltage divider can be pre-tuned with any precise values so that a post tuning is not necessary. This can be accomplished utilizing other electrical methodologies such as but not limited to differential op amps, voltage transformers and resistor divider networks located on ceramic wafers. The inventors understand that there are many alternative embodiments and only a few have been described.

FIG. 8 is an exemplary circuit diagram of a voltage sensing system for sensing voltages of a three phase electrical distribution system in accordance with the present disclosure. Voltage input circuitry for Phases A, B, C and neutral are shown. The neutral voltage input (labeled Voltage Input-N) includes a voltage divider having resistors RN:1 and RN:2 and a voltage follower. The output VN1 of the voltage follower is provided to the non-inverting (+) input of the op amp 415-1, 415-2, 415-3 of each voltage input circuit, i.e., voltage input-A, voltage input-B and voltage input-C. Each voltage input circuit includes a respective voltage divider (e.g., in voltage input A, the voltage divider includes resistors RA:1 and RA:2) and an adjustable resistance component 417. In FIG. 8, the adjustable resistance component 417 is illustrated in two parts, e.g., in voltage input-A, 417-1:A represents an adjustable resistance and 417-1:B represents a programming interface which enables the adjustment of the variable resistance 417-1:A. It is to be appreciated that although 417-1:A and 417-1B are shown separated, the two portions are embodied as one physical component. An output of the adjustable resistance component 417 is provided to the inverting (−) input of the respective op amp, wherein the output of the respective op amp is provided to an anti-aliasing filter. The configurations for voltage input-B and voltage input-C are substantially similar to the above-described configurations for voltage input-A. As described above, resistors RN:1 and RN:2 are fixed or selected with a predetermined value. The adjustable resistance component 417-1, 417-2, 417-3 is then adjusted for each voltage input so the resistance ratios as shown in equation (5) are equal resulting in highly accurate sensed voltages for each phase.

Referring back to FIG. 2, the CPU 18 is configured for receiving the digital signals from the ADCs 14 to perform the necessary calculations to determine the power usage and controlling the overall operations of the IED 10. In another embodiment, the DSP 16 will receive the digital signals from the ADCs 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. In one embodiment, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, a uninterruptible power supply (UPS), etc.

The IED 10 of the present disclosure will have user interface for interacting with a user and for communicating events, alarms and instructions to the user. The user interface will include a display 22 for providing visual indications to the user. The display 22 may include a touch screen, a liquid crystal display (LCD), a plurality of LED number segments, individual light bulbs or any combination of these. The display 22 may provide the information to the user in the form of alpha-numeric lines, computer-generated graphics, videos, etc. Visual information provided on the display 22 may include but is not limited to instructional videos, operating manuals associated with an IED, a flowchart for troubleshooting, a checklist for troubleshooting, etc. Digital files including the various visual instructions are stored in either memory 28 or retrieved from a remote event server.

The user interface will also include an audible output device 24, e.g., a speaker. The speaker 24 will be coupled to the CPU 18 via a digital-to-analog converter (D/A) 26 for converting digital audio files stored in memory 28 to analog signals playable by the speaker 22. The audible output device 24 may simply provide audible instructions to a user when an event is detected or may provided audio with a corresponding video being displayed on the display 22.

The device 100 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The memory 28 is configured for storing the files including the visual and/or audible instructions. The memory 28 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded with new instruction files as needed.

In one embodiment, the digital audio files may be programmed directly through the IED 10. In this embodiment, the IED 10 will include an audio input device 30, e.g., a microphone, for receiving spoken words in the form of analog signals. The analog signals will then be sent to an analog-to-digital converter (A/D) 32 to convert the analog signals into digital signals understandable by the CPU 18. The CPU 18 will then store the recorded digital audio file in the memory 28. The user may associate the recorded digital file with a particular alarm through the touch screen display 22. Alternatively, the user may associate the recorded digital file with an event code.

In a further embodiment, the IED 10 will include a communication device 34 for enabling communications between the IED 10 and other computing devices, e.g., a desktop computer, laptop computer, other IEDs, etc. The communication device 34 may be a modem, network interface card (NIC), wireless transceiver, etc. The communication device 34 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data.

Figure 4:
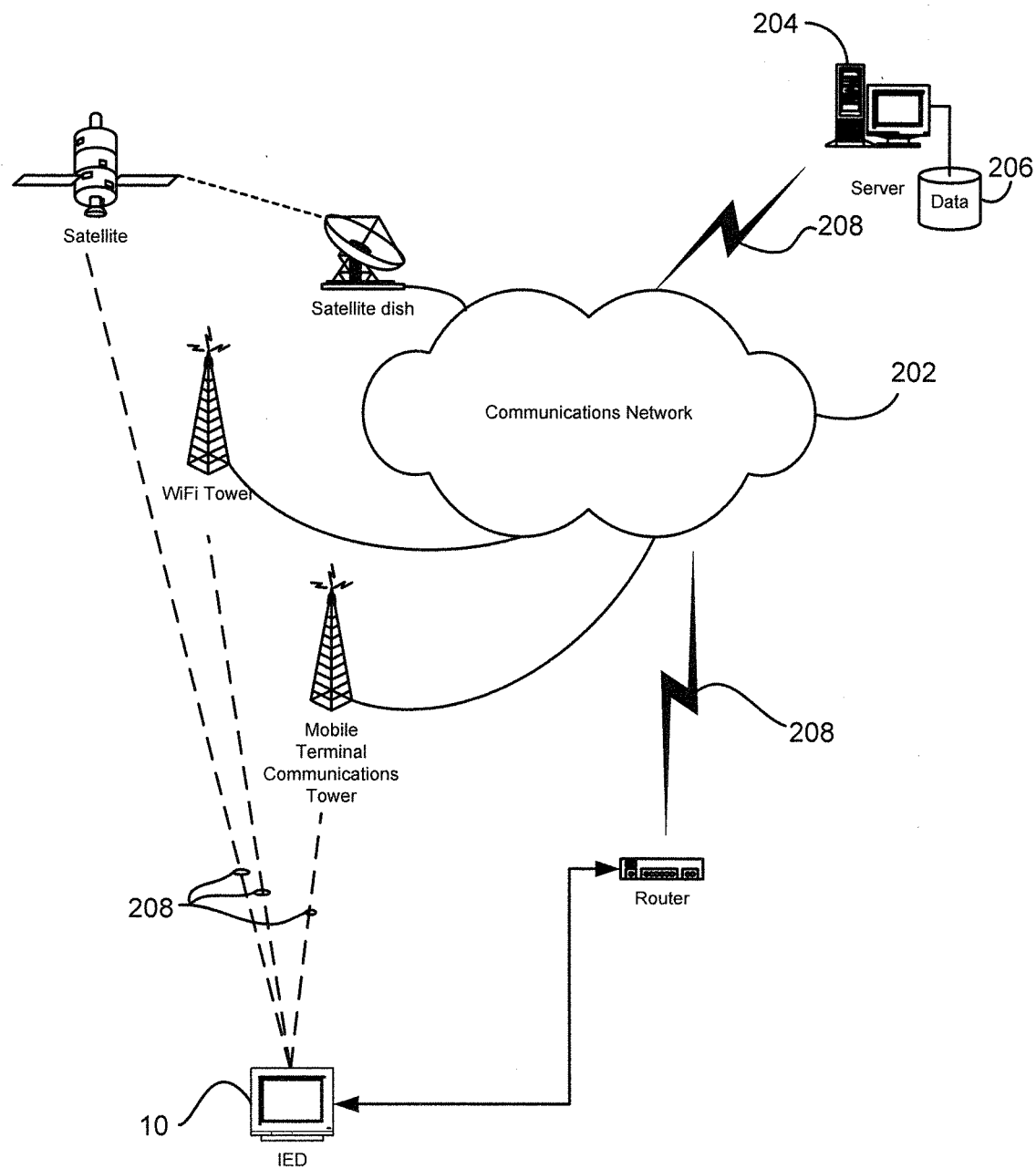
FIG. 4 is a system employing an intelligent electronic device in accordance with one embodiment of the present disclosure.

Referring to FIG. 4, The IED 10 will communicate to a server 204 via a communication network 202. The IED 10 and server 204 may be connected to the communications network 202, e.g., the Internet, by any known means, for example, a hardwired or wireless connection 208, such as dial-up, hardwired, cable, DSL, satellite, cellular, PCS, wireless transmission (e.g., 802.11a/b/g), etc. It is to be appreciated that the network 202 may be a local area network (LAN), wide area network (WAN), the Internet or any known network that couples a plurality of computers to enable various modes of communication via network messages. Furthermore, the server 204 will communicate using the various protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. Furthermore, the IED 10 and server 204 will employ various metering protocols including but not limited to Modbus, Modbus/TCP, DNP 3.0, etc. The server 204 will further include a storage medium 206 for storing a database of instructional videos, operating manuals, etc., the details of which will be described in detail below.

In this embodiment, the digital audio and/or video files, e.g., instruction files, may be recorded on a remote server 204 and downloaded to the IED 10 via the communication device 34 over a network, e.g., the Internet. In one embodiment, the server 204 includes a database 206 of predetermined instruction files which may be downloaded to the IED 10 and stored in the memory 28 upon an event command issued by a user, on a schedule or by triggered by the IED 10. In another embodiment, upon each detection of an event, the IED 10 will transmit to the server 204 an event code and the server 204 will return an instruction file associated to the event code. In this embodiment, the instruction files will be maintained in one location ensuring all available IEDs 10 in a network will access the most up-to-date instructions It is to be appreciated that any known or to be developed digital audio and/or visual format may be employed in the IED of the present disclosure, e.g., MP3, WMA (Windows Media Audio), WAV, Real Audio, MIDI, etc. Furthermore, the remote server 204 will include a plurality of digital file converters for converting the digital files in database 206 from any available format to a format compatible with the IED.

In a further embodiment, microphone 106 and speaker 24 are further coupled to the communication device 34 for enabling voice communication from the IED to a remote location. In one embodiment, the communication device 34 will enable voice communications with VoIP (Voice over Internet Protocol) or may include a mobile communications module operating on CDMA, PCS, GSM or any other known wireless communication technology.

It is to be appreciated that the communication device 34 may include a single integrated circuit chip to perform data transfer and voice communications or a single module including a separate data transfer chip, e.g., a WiFi transceiver, and a separate voice communication chip, e.g., a CDMA chip. In one embodiment, the communication device 34 will operate on the wireless GPRS (General Packet Radio Service) data protocol or a 3G protocol such as W-CDMA, CDMA2000 and TD-SCDMA. Both the GPRS and 3G protocols have the ability to carry both voice and data over the same service.

In this embodiment, when an event is detected, an operator at the location of the IED 10 may communicate with a remote operator, e.g., a technical support operator, for facilitating the rectification of the event. The operator at the IED 10 will have a two-way communication with the technical support operator in an attempt to troubleshoot the event.

It is to be understood that the present disclosure may be implemented in various forms of hardware, software, firmware, special purpose processors, or a combination thereof. The IED also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device, comprising:
a first voltage input for receiving a sensed voltage from a first phase of an electrical distribution system, the first voltage input being coupled to a first voltage divider;
a second voltage input for receiving a sensed voltage from a neutral phase of the electrical distribution system, the second voltage input being coupled to a second voltage divider; and
an inverting operational amplifier (op amp) coupled to the first and second voltage inputs for providing an output proportional to the voltage of the first phase referenced to the neutral phase, an inverting input of the op amp is coupled to an output of the first voltage divider and a non-inverting input of the op amp is coupled to an output of the second voltage divider,
wherein the first voltage divider is adjustable to match a ratio of the first voltage divider to a ratio of the second voltage divider.

2. The intelligent electronic device as in claim 1, wherein the second voltage divider is adjustable.

3. The intelligent electronic device as in claim 1, wherein the first voltage divider includes a fixed resistance component and a variable resistance component.

4. The intelligent electronic device as in claim 3, wherein the variable resistance component includes a first variable resistance and a second variable resistance, wherein a sum of the first and second variable resistance is fixed.

5. The intelligent electronic device as in claim 3, wherein the variable resistance component is a potential meter.

6. The intelligent electronic device as in claim 3, further comprising a controller for tuning the variable resistance component to match the ratio of the first voltage divider to the ratio of the second voltage divider.

7. The intelligent electronic device as in claim 3, further comprising a field programmable gate array (FPGA) for tuning the variable resistance component to match the ratio of the first voltage divider to the ratio of the second voltage divider.

8. The intelligent electronic device as in claim 1, further comprising:
a first potential transformer having an input coupled to the first phase of the electrical distribution system and an output coupled to the first voltage input; and a second potential transformer having an input coupled to the neutral phase of the electrical distribution system and an output coupled to the second voltage input.

9. The intelligent electronic device as in claim 1, further comprising a controller for tuning the first voltage divider to match the ratio of the first voltage divider to the ratio of the second voltage divider.

10. The intelligent electronic device as in claim 1, further comprising a field programmable gate array (FPGA) for tuning the first voltage divider to match the ratio of the first voltage divider to the ratio of the second voltage divider.

11. The intelligent electronic device as in claim 1, further comprising an anti-aliasing filter having an input coupled to the output of the inverting operational amplifier (op amp).

12. The intelligent electronic device as in claim 1, further comprising at least one processing device configured to tune the first voltage divider to match the ratio of the first voltage divider to the ratio of the second voltage divider.

13. The intelligent electronic device as in claim 12, wherein the at least one processing device is coupled to the output of the inverting operational amplifier (op amp) and further configured to receive the output from the inverting operational amplifier (op amp) and calculate at least one parameter of the electrical distribution system based on the received output.

14. The intelligent electronic device as in claim 13, further comprising a communication device configured to communicate the at least one parameter to at least one external device.

15. The intelligent electronic device as in claim 14, wherein the communication device wirelessly communicates to the at least one external device.

16. The intelligent electronic device as in claim 15, wherein the communication device operates on a Bluetooth™ protocol.

17. The intelligent electronic device as in claim 15, wherein the communication device operates on a WiFi™ protocol.

18. A sensor comprising:
a potential transformer having an input coupled to a first phase of an electrical distribution system and an output coupled to a first voltage divider;
a voltage input for receiving a sensed voltage from a neutral phase of the electrical distribution system, the voltage input being coupled to a second voltage divider; and
an inverting operational amplifier (op amp) coupled to the first and second voltage inputs for providing an output proportional to the voltage of the first phase referenced to the neutral phase, an inverting input of the op amp is coupled to an output of the first voltage divider and a non-inverting input of the op amp is coupled to an output of the second voltage divider,
wherein the first voltage divider is adjustable to match a ratio of the first voltage divider to a ratio of the second voltage divider.

19. The sensor as in claim 18, wherein the first voltage divider includes a fixed resistance component and a variable resistance component.

20. The sensor as in claim 19, wherein the variable resistance component is a potential meter.

21. The sensor as in claim 19, further comprising a controller for tuning the variable resistance component to match the ratio of the first voltage divider to the ratio of the second voltage divider.

22. The sensor as in claim 19, wherein the variable resistance component includes a first variable resistance and a second variable resistance, wherein a sum of the first and second variable resistance is fixed.

23. An intelligent electronic device, comprising:
a neutral voltage input for receiving a sensed voltage from a neutral phase of an electrical distribution system, the neutral voltage input being coupled to a neutral voltage divider having a first and second fixed resistor;
at least one phase voltage input for receiving a sensed voltage from at least one phase of the electrical distribution system, the at least one phase voltage input being coupled to a phase voltage divider, wherein the phase voltage divider is adjustable to match a ratio of the phase voltage divider to a ratio of the neutral voltage divider;
at least one inverting operational amplifier (op amp) coupled to the neutral voltage input and the at least one phase voltage input for providing an output proportional to the voltage of the at least one phase referenced to the neutral phase, an inverting input of the at least one op amp is coupled to an output of the phase voltage divider and a non-inverting input of the at least one op amp is coupled to an output of the neutral voltage divider; and
a controller for adjusting the phase voltage divider to match the ratio of the phase voltage divider to the ratio of the neutral voltage divider.

24. The intelligent electronic device as in claim 23, wherein the phase voltage divider includes a fixed resistance component and a variable resistance component.

25. The intelligent electronic device as in claim 24, wherein the variable resistance component includes a first variable resistance and a second variable resistance, wherein a sum of the first and second variable resistance is fixed.

26. The intelligent electronic device as in claim 24, wherein the variable resistance component is a potential meter.

27. The intelligent electronic device as in claim 24, wherein the variable resistance component includes an interface for adjusting the variable resistance.

28. The intelligent electronic device as in claim 23, wherein the controller is a field programmable gate array (FPGA).

29. The intelligent electronic device as in claim 23, further comprising an anti-aliasing filter having an input coupled to the output of each of the at least one inverting operational amplifier (op amp).

30. The intelligent electronic device as in claim 23, wherein the controller is coupled to the output of each of the at least one inverting operational amplifier (op amp) and further configured to receive the output from each of the at least one inverting operational amplifier (op amp) and calculate at least one parameter of the electrical distribution system based on the received output.

31. The intelligent electronic device as in claim 30, further comprising a communication device configured to communicate the at least one parameter to at least one external device.

32. The intelligent electronic device as in claim 31, wherein the communication device wirelessly communicates to the at least one external device.

33. The intelligent electronic device as in claim 32, wherein the communication device operates on a Bluetooth™ protocol.

34. The intelligent electronic device as in claim 32, wherein the communication device operates on a WiFi™ protocol.

35. An intelligent electronic device, comprising:
- a neutral voltage input configured to receive a sensed voltage from a neutral phase of an electrical distribution system, the neutral voltage input being coupled to a neutral voltage divider;
- at least one phase voltage input configured to receive a sensed voltage from at least one phase of the electrical distribution system, the at least one phase voltage input being coupled to a phase voltage divider; and
- at least one inverting operational amplifier (op amp) coupled to the neutral voltage input and the at least one phase voltage input and configured to provide an output proportional to the voltage of the at least one phase referenced to the neutral phase, an inverting input of the at least one op amp is coupled to an output of the phase voltage divider and a non-inverting input of the at least one op amp is coupled to an output of the neutral voltage divider,
- wherein a ratio of the phase voltage divider matches a ratio of the neutral voltage divider.

36. The intelligent electronic device as in claim 35, further comprising at least one processing device coupled to the output of the at least one inverting operational amplifier (op amp) and further configured to receive the output from the at least one inverting operational amplifier (op amp) and calculate at least one parameter of the electrical distribution system based on the received output.

37. The intelligent electronic device as in claim 36, further comprising a communication device configured to communicate the at least one parameter to at least one external device.

38. The intelligent electronic device as in claim 37, wherein the communication device wirelessly communicates to the at least one external device.

39. The intelligent electronic device as in claim 38, wherein the communication device operates on a Bluetooth™ protocol.

40. The intelligent electronic device as in claim 38, wherein the communication device operates on a WiFi™ protocol.

41. The intelligent electronic device as in claim 36, wherein the at least one processing device is a field programmable gate array (FPGA).

42. The intelligent electronic device as in claim 35, further comprising at least one anti-aliasing filter having an input coupled to the output of respective at least one inverting operational amplifier (op amp).

43. An intelligent electronic device, comprising:
- at least one first voltage input for receiving a sensed voltage from at least one first phase of an electrical distribution system, the at least one first voltage input being coupled to a first voltage divider;
- at least one second voltage input for receiving a sensed voltage from at least one second phase of the electrical distribution system, the at least one second voltage input being coupled to a second voltage divider; and
- at least one operational amplifier (op amp) coupled to the at least one first voltage input and the at least one second voltage input for providing an output proportional to the voltage of the at least one first phase referenced to the at least one second phase, a first input of the at least one op amp is coupled to an output of the first voltage divider and a second input of the at least one op amp is coupled to an output of the second voltage divider;
- wherein the first or second voltage divider is adjustable to match a ratio of the first voltage divider to a ratio of the second voltage divider.

44. The intelligent electronic device as in claim 43, further comprising an anti-aliasing filter having an input coupled to the output of a respective at least one operational amplifier (op amp).

45. The intelligent electronic device as in claim 43, further comprising at least one processing device configured to adjust the first voltage divider or the second voltage divider to match the ratio of the first voltage divider to the ratio of the second voltage divider.

46. The intelligent electronic device as in claim 45, wherein the at least one processing device is coupled to the output of the at least one operational amplifier (op amp) and further configured to receive the output from the at least one operational amplifier (op amp) and calculate at least one parameter of the electrical distribution system based on the received output.

47. The intelligent electronic device as in claim 43, further comprising:
- at least one processing device configured to adjust the first voltage divider or the second voltage divider to match the ratio of the first voltage divider to the ratio of the second voltage divider; and
- at least one anti-aliasing filter having an input coupled to the output of a respective at least one operational amplifier (op amp) and an output coupled to the at least one processing device,
- wherein the at least one processing device is further configured to receive the output from the at least one operational amplifier (op amp) and calculate at least one parameter of the electrical distribution system based on the received output.

48. The intelligent electronic device as in claim 47, wherein the at least one processing device is a field programmable gate array (FPGA).

49. An intelligent electronic device, comprising:
- a neutral voltage input configured to receive a sensed voltage from a neutral phase of an electrical distribution system, the neutral voltage input being coupled to a neutral voltage divider;
- at least one phase voltage input configured to receive a sensed voltage from at least one phase of the electrical distribution system, the at least one phase voltage input being coupled to a phase voltage divider; and
- at least one operational amplifier (op amp) coupled to the neutral voltage input and the at least one phase voltage input and configured to provide an output proportional to the voltage of the at least one phase referenced to the neutral phase, a first input of the at least one op amp is coupled to an output of the phase voltage divider and a second input of the at least one op amp is coupled to an output of the neutral voltage divider.

50. The intelligent electronic device as in claim 49, wherein a ratio of the phase voltage divider matches a ratio of the neutral voltage divider.

51. The intelligent electronic device as in claim 49, wherein the phase or neutral voltage divider is adjustable to match a ratio of the phase voltage divider to a ratio of the neutral voltage divider.

52. The intelligent electronic device as in claim 49, further comprising at least one processing device configured to adjust the phase voltage divider or the neutral voltage divider to match a ratio of the phase voltage divider to a ratio of the neutral voltage divider.

53. The intelligent electronic device as in claim 52, wherein the at least one processing device is coupled to the output of the at least one operational amplifier (op amp) and further configured to receive the output from the at least one operational amplifier (op amp) and calculate at least one parameter of the electrical distribution system based on the received output.

54. The intelligent electronic device as in claim 53, further comprising at least one anti-aliasing filter disposed between an output of a respective at least one operational amplifier (op amp) and an input of the at least one processing device.

* * * * *